United States Patent
Zeng

(10) Patent No.: US 10,152,940 B2
(45) Date of Patent: Dec. 11, 2018

(54) GOA DRIVER CIRCUIT AND LIQUID CRYSTAL DISPLAY

(71) Applicant: Shenzhen China Star Optoelectronics Technology Co., Ltd., Shenzhen (CN)

(72) Inventor: Mian Zeng, Shenzhen (CN)

(73) Assignee: Shenzhen China Star Optoelectronics Technology Co., Ltd., Shenzhen (CN)

( * ) Notice: Subject to any disclaimer, the term of this patent is extended or adjusted under 35 U.S.C. 154(b) by 38 days.

(21) Appl. No.: 15/325,742

(22) PCT Filed: Dec. 28, 2016

(86) PCT No.: PCT/CN2016/112540
§ 371 (c)(1),
(2) Date: Jan. 12, 2017

(87) PCT Pub. No.: WO2018/094807
PCT Pub. Date: May 31, 2018

(65) Prior Publication Data
US 2018/0182339 A1   Jun. 28, 2018

(30) Foreign Application Priority Data

Nov. 28, 2016 (CN) .......................... 2016 1 1071751

(51) Int. Cl.
*G09G 3/36* (2006.01)
*G11C 19/28* (2006.01)

(52) U.S. Cl.
CPC .......... *G09G 3/3677* (2013.01); *G11C 19/28* (2013.01); *G09G 2300/0809* (2013.01); *G09G 2310/0208* (2013.01)

(58) Field of Classification Search
CPC ......... G09G 3/3677; G09G 2300/0809; G09G 2310/0208; G11C 19/28
USPC ........................................................ 345/100
See application file for complete search history.

(56) References Cited

U.S. PATENT DOCUMENTS

| | | | |
|---|---|---|---|
| 9,159,280 B1 * | 10/2015 | Yu | G11C 19/28 |
| 2010/0260312 A1 * | 10/2010 | Tsai | G09G 3/3677 377/79 |
| 2011/0234577 A1 * | 9/2011 | Yang | G09G 3/3677 345/212 |
| 2013/0070891 A1 | 3/2013 | Tsai et al. | |
| 2015/0318052 A1 | 11/2015 | Li | |
| 2016/0005372 A1 | 1/2016 | Yu | |
| 2017/0186387 A1 | 6/2017 | Wang et al. | |

FOREIGN PATENT DOCUMENTS

| CN | 103985341 | 8/2014 |
|---|---|---|
| CN | 104167191 | 11/2014 |
| CN | 105336305 | 2/2016 |
| CN | 105390115 | 3/2016 |
| CN | 106057157 | 10/2016 |

\* cited by examiner

*Primary Examiner* — Mark Edwards

(57) ABSTRACT

The present disclosure proposes a gate driver on array (GOA) driving circuit and a liquid crystal display. The GOA driving circuit includes cascaded GOA units. An Nth stage GOA unit outputs a gate driving signal to an Nth scan line on a display area. The Nth stage GOA unit includes a pull-up module, a pull-down module, a pull-up controlling module, a pull-down holding module, and a bootstrap capacitance module.

10 Claims, 2 Drawing Sheets

GOA DRIVER CIRCUIT AND LIQUID CRYSTAL DISPLAY

RELATED APPLICATIONS

This application is a National Phase of PCT Patent Application No. PCT/CN2016/112540 having International filing date of Dec. 28, 2016, which claims the benefit of priority of Chinese Patent Application No. 201611071751.8 filed on Nov. 28, 2016. The contents of the above applications are all incorporated by reference as if fully set forth herein in their entirety.

FIELD AND BACKGROUND OF THE INVENTION

The present disclosure relates to the field of liquid crystal display, and more particularly, to a gate driver on array (GOA) driver circuit and a liquid crystal display (LCD).

The gate driver on array (GOA) technique is that a gate driver circuit is formed in an array substrate based on the conventional transistor LCD array process. Pixels can be scanned row by row with the GOA technique.

Conventionally, a clock signal applied to a pull-up module of a current stage GOA unit is transmitted to a pull-up module of a next stage GOA unit via a transferring module of the current stage GOA unit. Not only arranging the transferring module raises a cost of GOA unit, but conducting the clock signal to the pull-up module of the next stage GOA unit via the transferring module of the current stage GOA unit causes limited pulling up ability.

Therefore, the prior art is defective and needs to be improved and developed.

SUMMARY OF THE INVENTION

An object of the present disclosure is to propose a gate driver on array (GOA) driver circuit and a liquid crystal display (LCD).

According to the present disclosure, a gate driver on array (GOA) driving circuit includes a plurality of cascaded GOA units. The Nth stage GOA unit outputs a gate driving signal to an Nth scan line on a display area. The Nth stage GOA unit includes a pull-up module coupled to a Nth gate signal node and the Nth scan line, a pull-down module coupled to the Nth scan line, a pull-up controlling module coupled to the Nth gate signal node, a pull-down holding module coupled to the Nth gate signal node, and a bootstrap capacitance module coupled to the Nth gate signal node and the Nth scan line.

A control terminal and an input terminal of the pull-up controlling module are coupled to an (N−1)th gate signal node and an (N−1)th scan line, respectively, and a control terminal of the pull-down module is coupled to an (N+1)th scan line.

Preferably, the pull-up controlling module comprises a first transistor which comprises a drain coupled to the (N−1)th scan line and a source coupled to the Nth gate signal node.

Preferably, the pull-up module comprises a second transistor which comprises a drain coupled to a high frequency clock signal, a gate coupled to the Nth gate signal node, and a source coupled to the Nth scan line.

Preferably, the pull-down module comprises:

a third transistor, comprising a drain coupled to the source of the second transistor and the Nth scan line, a gate coupled to the (N+1)th scan line, and a source coupled to a constant low voltage; and a fourth transistor, comprising a drain coupled to the Nth gate signal node, a gate coupled to the (N+1)th scan line, and a source coupled to the constant low voltage.

Preferably, the pull-down holding module comprises a first pull-down holding circuit, where the first pull-down holding circuit comprises:

a fifth transistor, comprising a drain coupled to a first low frequency clock signal, a gate coupled to the first low frequency clock signal, and a source;

a sixth transistor, comprising a drain coupled to the first low frequency clock signal, a gate coupled to the source of the fifth transistor, and a source;

a seventh transistor, comprising a drain coupled to the source of the fifth transistor and the gate of the sixth transistor, a gate coupled to the Nth gate signal node, and a source coupled to the constant low voltage;

an eighth transistor, comprising a drain coupled to the source of the sixth transistor, a gate coupled to the Nth gate signal node, and a source coupled to the constant low voltage;

a ninth transistor, comprising a drain coupled to the Nth scan line, a gate coupled to the source of the sixth transistor, and a source coupled to the constant low voltage; and a tenth transistor, comprising a drain coupled to the Nth gate signal node, a gate coupled to the source of the sixth transistor, and a source coupled to the constant low voltage.

Preferably, the pull-down holding module comprises a second pull-down holding circuit, where the second pull-down holding circuit comprises:

an eleventh transistor, comprising a drain coupled to a second low frequency clock signal, a gate coupled to the second low frequency clock signal, and a source;

a twelfth transistor, comprising a drain coupled to the second low frequency clock signal, a gate coupled to the source of the eleventh transistor, and a source;

a thirteenth transistor, comprising a drain coupled to the source of the eleventh transistor and the gate of the twelfth transistor, a gate coupled to the Nth gate signal node, and a source coupled to the constant low voltage;

an fourteenth transistor, comprising a drain coupled to the source of the twelfth transistor, a gate coupled to the Nth gate signal node, and a source coupled to the constant low voltage;

a fifteenth transistor, comprising a drain coupled to the Nth scan line, a gate coupled to the source of the twelfth transistor, and a source coupled to the constant low voltage; and a sixteenth transistor, comprising a drain coupled to the Nth gate signal node, a gate coupled to the source of the twelfth transistor, and a source coupled to the constant low voltage.

Preferably, the bootstrap capacitance module comprises a bootstrap capacitor coupled between the Nth gate signal node and the Nth scan line.

Preferably, the first low frequency clock signal is inverted to the second low frequency clock signal.

Preferably, the first low frequency clock signal and the second low frequency clock signal are coupled the plurality of GOA units through a common metallic line.

According to the present disclosure, a gate driver on array (GOA) driving circuit includes a plurality of cascaded GOA units. The Nth stage GOA unit outputs a gate driving signal to an Nth scan line on a display area. The Nth stage GOA unit includes a pull-up module coupled to a Nth gate signal node and the Nth scan line, a pull-down module coupled to the Nth scan line, a pull-up controlling module coupled to the Nth gate signal node, a pull-down holding module coupled to the Nth gate signal node, and a bootstrap capacitance module coupled to the Nth gate signal node and the Nth scan line.

A control terminal and an input terminal of the pull-up controlling module are coupled to an (N−1)th gate signal node and an (N−1)th scan line, respectively, and a control terminal of the pull-down module is coupled to an (N+1)th scan line.

The pull-up controlling module comprises a first transistor which comprises a drain coupled to the (N−1)th scan line and a source coupled to the Nth gate signal node.

The pull-up module comprises a second transistor which comprises a drain coupled to a high frequency clock signal, a gate coupled to the Nth gate signal node, and a source coupled to the Nth scan line.

The pull-down module comprises:

a third transistor, comprising a drain coupled to the source of the second transistor and the Nth scan line, a gate coupled to the (N+1)th scan line, and a source coupled to a constant low voltage; and a fourth transistor, comprising a drain coupled to the Nth gate signal node, a gate coupled to the (N+1)th scan line, and a source coupled to the constant low voltage.

The pull-down holding module comprises a first pull-down holding circuit, where the first pull-down holding circuit comprises:

a fifth transistor, comprising a drain coupled to a first low frequency clock signal, a gate coupled to the first low frequency clock signal, and a source;

a sixth transistor, comprising a drain coupled to the first low frequency clock signal, a gate coupled to the source of the fifth transistor, and a source;

a seventh transistor, comprising a drain coupled to the source of the fifth transistor and the gate of the sixth transistor, a gate coupled to the Nth gate signal node, and a source coupled to the constant low voltage;

an eighth transistor, comprising a drain coupled to the source of the sixth transistor, a gate coupled to the Nth gate signal node, and a source coupled to the constant low voltage;

a ninth transistor, comprising a drain coupled to the Nth scan line, a gate coupled to the source of the sixth transistor, and a source coupled to the constant low voltage; and a tenth transistor, comprising a drain coupled to the Nth gate signal node, a gate coupled to the source of the sixth transistor, and a source coupled to the constant low voltage.

The pull-down holding module comprises a second pull-down holding circuit, where the second pull-down holding circuit comprises:

an eleventh transistor, comprising a drain coupled to a second low frequency clock signal, a gate coupled to the second low frequency clock signal, and a source;

a twelfth transistor, comprising a drain coupled to the second low frequency clock signal, a gate coupled to the source of the eleventh transistor, and a source;

a thirteenth transistor, comprising a drain coupled to the source of the eleventh transistor and the gate of the twelfth transistor, a gate coupled to the Nth gate signal node, and a source coupled to the constant low voltage;

an fourteenth transistor, comprising a drain coupled to the source of the twelfth transistor, a gate coupled to the Nth gate signal node, and a source coupled to the constant low voltage;

a fifteenth transistor, comprising a drain coupled to the Nth scan line, a gate coupled to the source of the twelfth transistor, and a source coupled to the constant low voltage; and a sixteenth transistor, comprising a drain coupled to the Nth gate signal node, a gate coupled to the source of the twelfth transistor, and a source coupled to the constant low voltage.

The bootstrap capacitance module comprises a bootstrap capacitor coupled between the Nth gate signal node and the Nth scan line.

The first low frequency clock signal is inverted to the second low frequency clock signal.

The first low frequency clock signal and the second low frequency clock signal are coupled the plurality of GOA units through a common metallic line.

The present disclosure also proposes a liquid crystal display comprising a gate driver on array (GOA) driver circuit as disclosed above.

The present disclosure proposes a Nth stage GOA unit utilizing a gate signal node Q(N) as a transferring signal without using a transferring module. Furthermore, voltage applied on a gate signal node Q(N−1) is used to trigger the pull-up controlling module of the Nth stage GOA unit. When voltage applied on the gate signal node Q(N−1) is at high voltage level, signal applied on the scan line G(N−1) is transmitted to the gate signal node Q(N), so that the pull-up controlling module receives greater turn-on voltage and enhances pull-up voltage.

DESCRIPTION OF THE PREFERRED SPECIFIC EMBODIMENTS OF THE INVENTION

Figure 1:
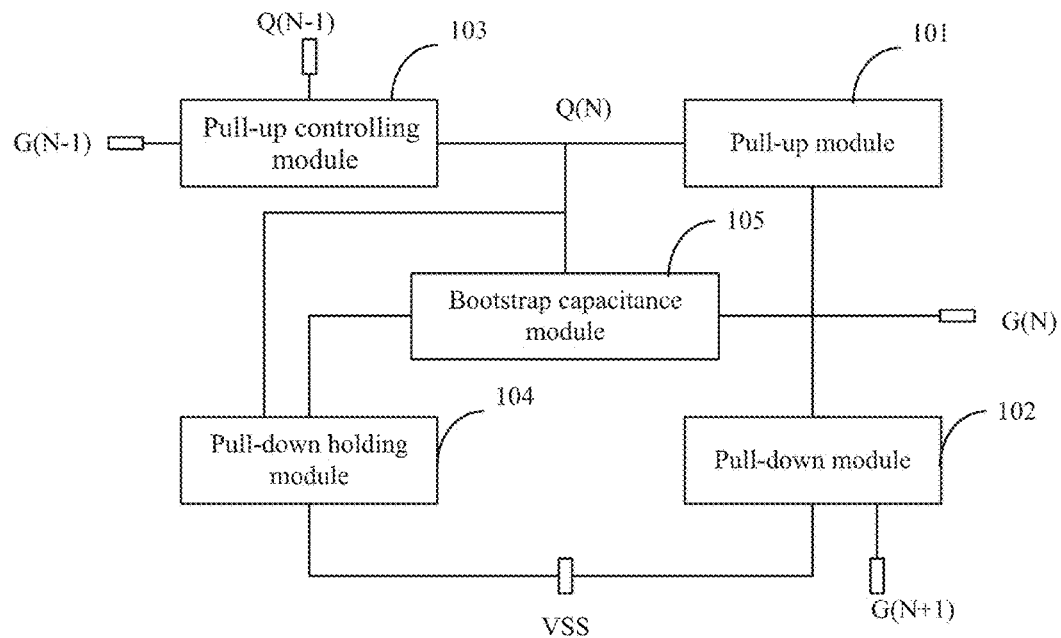
FIG. 1 illustrates a block diagram of an Nth GOA driving circuit according to a first embodiment of the present disclosure.

The following description of every embodiment with reference to the accompanying drawings is used to exemplify a specific embodiment, which may be carried out in the present invention. Directional terms mentioned in the present invention, such as "top", "bottom", "front", "back", "left", "right", "inside", "outside", "side" etc., are only used with reference to the orientation of the accompanying drawings. Therefore, the used directional terms are intended to illustrate, but not to limit, the present invention.

In the drawings, the components having similar structures are denoted by the same numerals.

Please refer to FIG. 1. A gate driver on array (GOA) driving circuit includes a plurality of cascaded GOA units. An Nth stage GOA unit outputs a gate driving signal to an Nth scan line on a display area. The Nth stage GOA unit includes a pull-up module 101, a pull-down module 102, a pull-up controlling module 103, a pull-down holding module 104, and a bootstrap capacitance module 105.

The pull-up module 101 is coupled to a Nth gate signal node Q(N) and the Nth scan line G(N). The pull-down module 102 is coupled to the Nth scan line G(N). The pull-up controlling module 103 is coupled to the Nth gate signal node Q(N). The pull-down holding module 104 is coupled to the Nth gate signal node Q(N). The bootstrap capacitance module 105 is coupled to the Nth gate signal node Q(N) and the Nth scan line G(N). A control terminal and an input terminal of the pull-up controlling module 103 are coupled to an (N−1)th gate signal node Q(N−1) and an (N−1)th scan line G(N−1), respectively. A control terminal of the pull-down module 102 is coupled to an (N+1)th scan line G(N+1). It is noted that a control terminal and an input terminal of the pull-up controlling module 103 of the first GOA unit are coupled to a start signal STV and a driving signal, respectively.

Figure 2:
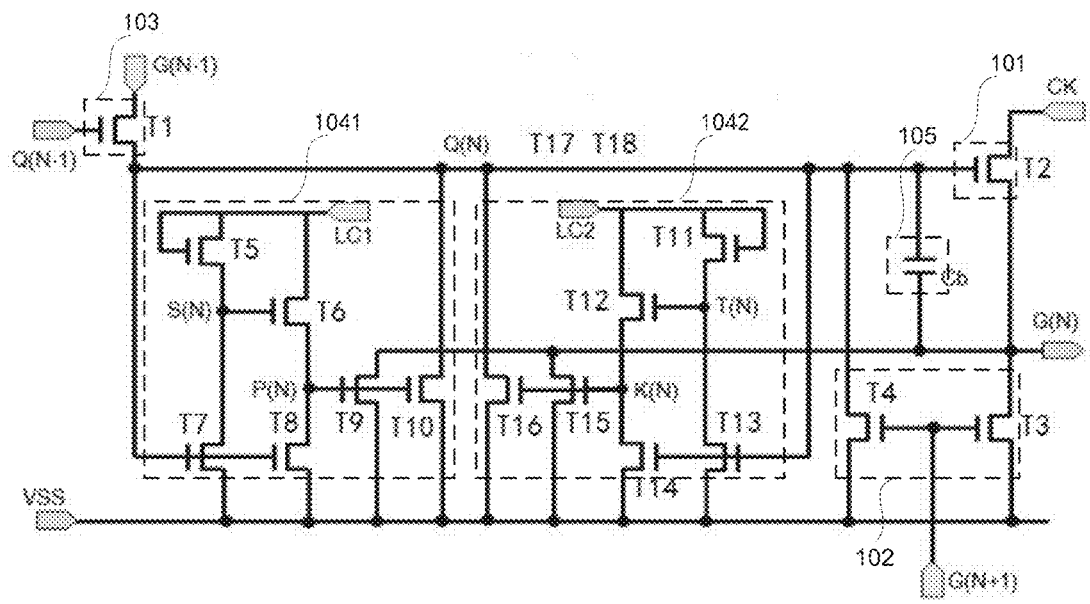
FIG. 2 illustrates a circuit diagram of the Nth GOA driving circuit shown in FIG. 2.

As illustrated in FIG. 2, the pull-up module 101 includes a second transistor T2 which comprises a drain coupled to a high frequency clock signal, a gate coupled to the Nth gate signal node Q(N), and a source coupled to the Nth scan line G(N). The pull-up module 101 is used to transmit the high frequency clock signal to a gate driving signal of the Nth scan line G(N).

The pull-up controlling module 103 includes a first transistor T1 which comprises a drain coupled to the (N−1)th scan line and a source coupled to the Nth gate signal node Q(N). The pull-up controlling module 103 is used to control a on/off state of the second transistor T2.

The pull-down module 102 includes a third transistor T3 and a fourth transistor T4. The third transistor T3 includes a drain coupled to the source of the second transistor T2 and the Nth scan line G(N), a gate coupled to the (N+1)th scan line G(N+1), and a source coupled to a constant low voltage VSS. The fourth transistor T4 includes a drain coupled to the Nth gate signal node Q(N), a gate coupled to the (N+1)th scan line G(N+1), and a source coupled to the constant low voltage VSS. The pull-down module 102 is used to rapidly pull down the gate driving signal of the Nth scan line to a low voltage level The pull-down holding module 104 includes a first pull-down holding circuit 1041 and a second pull-down holding circuit 1042.

The first pull-down holding circuit 1041 includes a fifth transistor T5, a sixth transistor T6, a seventh transistor T7, an eighth transistor T8, a ninth transistor T9, and a tenth transistor T10. The fifth transistor T5 includes a drain coupled to a first low frequency clock signal LC1, a gate coupled to the first low frequency clock signal LC1, and a source. The sixth transistor T6 includes a drain coupled to the first low frequency clock signal LC1, a gate coupled to the source of the fifth transistor T5, and a source. The seventh transistor T7 includes a drain coupled to the source of the fifth transistor T5 and the gate of the sixth transistor T6, a gate coupled to the Nth gate signal node Q(N), and a source coupled to the constant low voltage VSS. The eighth transistor T8 includes a drain coupled to the source of the sixth transistor T6, a gate coupled to the Nth gate signal node Q(N), and a source coupled to the constant low voltage VSS. The ninth transistor T9 includes a drain coupled to the Nth scan line G(N), a gate coupled to the source of the sixth transistor T6, and a source coupled to the constant low voltage VSS. The tenth transistor T10 includes a drain coupled to the Nth gate signal node Q(N), a gate coupled to the source of the sixth transistor T6, and a source coupled to the constant low voltage VSS.

The second pull-down holding circuit 1042 includes an eleventh transistor T11, a twelfth transistor T12, a thirteenth transistor T13, a fourteenth transistor T14, a fifteenth transistor T15, and a sixteenth transistor T16. The eleventh transistor T11 includes a drain coupled to a second low frequency clock signal LC2, a gate coupled to the second low frequency clock signal LC2, and a source. The twelfth transistor T12 includes a drain coupled to the second low frequency clock signal LC2, a gate coupled to the source of the eleventh transistor T11, and a source. The thirteenth transistor T13 includes a drain coupled to the source of the eleventh transistor T11 and the gate of the twelfth transistor T12, a gate coupled to the Nth gate signal node Q(N), and a source coupled to the constant low voltage VSS. The fourteenth transistor T14 includes a drain coupled to the source of the twelfth transistor T12, a gate coupled to the Nth gate signal node Q(N), and a source coupled to the constant low voltage VSS. The fifteenth transistor T15 includes a drain coupled to the Nth scan line G(N), a gate coupled to the source of the twelfth transistor T12, and a source coupled to the constant low voltage VSS. The sixteenth transistor T16 includes a drain coupled to the Nth gate signal node Q(N), a gate coupled to the source of the twelfth transistor T12, and a source coupled to the constant low voltage VSS.

The bootstrap capacitance module 105 includes a bootstrap capacitor Cb coupled between the Nth gate signal node Q(N) and the Nth scan line G(N).

The first low frequency clock signal LC1 and the second low frequency clock signal LC2 are coupled the plurality of GOA units through a common metallic line.

Figure 3:
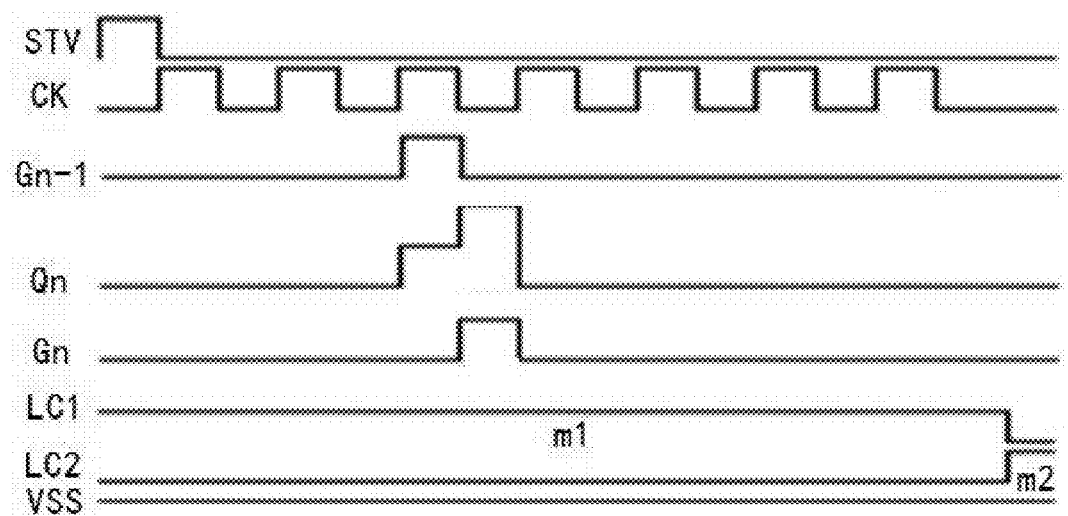
FIG. 3 illustrates waveforms of signals applied on the GOA driving circuit according to the embodiment of the present disclosure.

As illustrated in FIG. 3, the first low frequency clock signal LC1 is inverted to the second low frequency clock signal LC2. The first pull-down holding circuit 1041 and second pull-down holding circuit 1042 alternatively work according to the first low frequency clock signal LC1 and the second low frequency clock signal LC2. Therefore, each of the first pull-down holding circuit 1041 and second pull-down holding circuit 1042 does not work continuously, so that voltage stress applied on transistors of the circuits is lowered and enhance reliability of the circuits.

Specifically, as illustrated in FIG. 3, during a time period m1, the first pull-down holding circuit 1041 works in response to a high voltage level of the first low frequency clock signal LC1. During a time period m2, the second pull-down holding circuit 1042 works in response to a high voltage level of the second low frequency clock signal LC2.

The present disclosure proposes a Nth stage GOA unit utilizing a gate signal node Q(N) as a transferring signal without using a transferring module. Furthermore, voltage applied on a gate signal node Q(N−1) is used to trigger the pull-up controlling module of the Nth stage GOA unit. When voltage applied on the gate signal node Q(N−1) is at high voltage level, signal applied on the scan line G(N−1) is transmitted to the gate signal node Q(N), so that the pull-up controlling module receives greater turn-on voltage and enhances pull-up voltage.

The present disclosure further proposes a liquid crystal display device using a GOA driving circuit as provided in the above embodiments. As the above, it should be understood that the present disclosure has been described with reference to certain preferred and alternative embodiments which are intended to be exemplary only and do not limit the full scope of the present disclosure as set forth in the appended claims.

What is claimed is:

1. A gate driver on array (GOA) driving circuit, comprising a plurality of cascaded GOA units, an Nth stage GOA unit outputting a gate driving signal to an Nth scan line on a display area, the Nth stage GOA unit comprising:
   a pull-up module coupled to a Nth gate signal node and the Nth scan line;
   a pull-down module coupled to the Nth scan line;
   a pull-up controlling module coupled to the Nth gate signal node;
   a pull-down holding module coupled to the Nth gate signal node; and a bootstrap capacitance module coupled to the Nth gate signal node and the Nth scan line, wherein a control terminal and an input terminal of the pull-up controlling module are coupled to an (N−1)th gate signal node and an (N−1)th scan line, respectively, and a control terminal of the pull-down module is coupled to an (N+1)th scan line;

wherein the pull-up controlling module comprises a first transistor which comprises a drain coupled to the (N−1)th scan line and a source coupled to the Nth gate signal node;

wherein the pull-down holding module comprises a first pull-down holding circuit, where the first pull-down holding circuit comprises:

a fifth transistor comprising a drain coupled to a first low frequency clock signal, a gate coupled to the first low frequency clock signal, and a source;

a sixth transistor comprising a drain coupled to the first low frequency clock signal, a gate coupled to the source of the fifth transistor, and a source;

a seventh transistor comprising a drain coupled to the source of the fifth transistor and the gate of the sixth transistor, a gate coupled to the Nth gate signal node, and a source coupled to the constant low voltage;

an eighth transistor comprising a drain coupled to the source of the sixth transistor, a gate coupled to the Nth gate signal node, and a source coupled to the constant low voltage;

a ninth transistor comprising a drain coupled to the Nth scan line, a gate coupled to the source of the sixth transistor, and a source coupled to the constant low voltage; and a tenth transistor comprising a drain coupled to the Nth gate signal node, a gate coupled to the source of the sixth transistor, and a source coupled to the constant low voltage.

2. The GOA driving circuit of claim 1, wherein the pull-up module comprises a second transistor which comprises a drain coupled to a high frequency clock signal, a gate coupled to the Nth gate signal node, and a source coupled to the Nth scan line.

3. The GOA driving circuit of claim 1, wherein the pull-down module comprises:

a third transistor, comprising a drain coupled to the source of the second transistor and the Nth scan line, a gate coupled to the (N+1)th scan line, and a source coupled to a constant low voltage; and a fourth transistor, comprising a drain coupled to the Nth gate signal node, a gate coupled to the (N+1)th scan line, and a source coupled to the constant low voltage.

4. The GOA driving circuit of claim 1, wherein the pull-down holding module comprises a second pull-down holding circuit, where the second pull-down holding circuit comprises:

an eleventh transistor, comprising a drain coupled to a second low frequency clock signal, a gate coupled to the second low frequency clock signal, and a source;

a twelfth transistor, comprising a drain coupled to the second low frequency clock signal, a gate coupled to the source of the eleventh transistor, and a source;

a thirteenth transistor, comprising a drain coupled to the source of the eleventh transistor and the gate of the twelfth transistor, a gate coupled to the Nth gate signal node, and a source coupled to the constant low voltage;

an fourteenth transistor, comprising a drain coupled to the source of the twelfth transistor, a gate coupled to the Nth gate signal node, and a source coupled to the constant low voltage;

a fifteenth transistor, comprising a drain coupled to the Nth scan line, a gate coupled to the source of the twelfth transistor, and a source coupled to the constant low voltage; and a sixteenth transistor, comprising a drain coupled to the Nth gate signal node, a gate coupled to the source of the twelfth transistor, and a source coupled to the constant low voltage.

5. The GOA driving circuit of claim 1, wherein the bootstrap capacitance module comprises a bootstrap capacitor coupled between the Nth gate signal node and the Nth scan line.

6. The GOA driving circuit of claim 4, wherein the first low frequency clock signal is inverted to the second low frequency clock signal.

7. The GOA driving circuit of claim 4, wherein the first low frequency clock signal is coupled to the plurality of GOA units through a common metallic line and the second low frequency clock signal is coupled to the plurality of GOA units through another common metallic line.

8. A gate driver on array (GOA) driving circuit, comprising a plurality of cascaded GOA units, an Nth stage GOA unit outputting a gate driving signal to an Nth scan line on a display area, the Nth stage GOA unit comprising:

a pull-up module coupled to a Nth gate signal node and the Nth scan line;

a pull-down module coupled to the Nth scan line;

a pull-up controlling module coupled to the Nth gate signal node;

a pull-down holding module coupled to the Nth gate signal node; and a bootstrap capacitance module coupled to the Nth gate signal node and the Nth scan line, wherein a control terminal and an input terminal of the pull-up controlling module are coupled to an (N−1)th gate signal node and an (N−1)th scan line, respectively, and a control terminal of the pull-down module is coupled to an (N+1)th scan line, wherein the pull-up controlling module comprises a first transistor which comprises a drain coupled to the (N−1)th scan line and a source coupled to the Nth gate signal node, wherein the pull-up module comprises a second transistor which comprises a drain coupled to a high frequency clock signal, a gate coupled to the Nth gate signal node, and a source coupled to the Nth scan line, wherein the pull-down module comprises:

a third transistor, comprising a drain coupled to the source of the second transistor and the Nth scan line, a gate coupled to the (N+1)th scan line, and a source coupled to a constant low voltage; and a fourth transistor, comprising a drain coupled to the Nth gate signal node, a gate coupled to the (N+1)th scan line, and a source coupled to the constant low voltage, wherein the pull-down holding module comprises a first pull-down holding circuit, where the first pull-down holding circuit comprises:

a fifth transistor, comprising a drain coupled to a first low frequency clock signal, a gate coupled to the first low frequency clock signal, and a source;

a sixth transistor, comprising a drain coupled to the first low frequency clock signal, a gate coupled to the source of the fifth transistor, and a source;

a seventh transistor, comprising a drain coupled to the source of the fifth transistor and the gate of the sixth transistor, a gate coupled to the Nth gate signal node, and a source coupled to the constant low voltage;

an eighth transistor, comprising a drain coupled to the source of the sixth transistor, a gate coupled to the Nth gate signal node, and a source coupled to the constant low voltage;

a ninth transistor, comprising a drain coupled to the Nth scan line, a gate coupled to the source of the sixth transistor, and a source coupled to the constant low voltage; and a tenth transistor, comprising a drain coupled to the Nth gate signal node, a gate coupled to the source of the sixth transistor, and a source coupled to the constant low voltage, wherein the pull-down holding module comprises a second pull-down holding circuit, where the second pull-down holding circuit comprises:

an eleventh transistor, comprising a drain coupled to a second low frequency clock signal, a gate coupled to the second low frequency clock signal, and a source;

a twelfth transistor, comprising a drain coupled to the second low frequency clock signal, a gate coupled to the source of the eleventh transistor, and a source;

a thirteenth transistor, comprising a drain coupled to the source of the eleventh transistor and the gate of the twelfth transistor, a gate coupled to the Nth gate signal node, and a source coupled to the constant low voltage;

an fourteenth transistor, comprising a drain coupled to the source of the twelfth transistor, a gate coupled to the Nth gate signal node, and a source coupled to the constant low voltage;

a fifteenth transistor, comprising a drain coupled to the Nth scan line, a gate coupled to the source of the twelfth transistor, and a source coupled to the constant low voltage; and a sixteenth transistor, comprising a drain coupled to the Nth gate signal node, a gate coupled to the source of the twelfth transistor, and a source coupled to the constant low voltage, wherein the bootstrap capacitance module comprises a bootstrap capacitor coupled between the Nth gate signal node and the Nth scan line, wherein the first low frequency clock signal is inverted to the second low frequency clock signal, and wherein the first low frequency clock signal and the second low frequency clock signal are coupled the plurality of GOA units through a common metallic line.

9. A liquid crystal display comprising a gate driver on array (GOA) driver circuit as claimed in claim 1.

10. A liquid crystal display comprising a gate driver on array (GOA) driver circuit as claimed in claim 8.

* * * * *